(12) United States Patent
Escuti et al.

(10) Patent No.: US 9,690,026 B2
(45) Date of Patent: Jun. 27, 2017

(54) DIRECT WRITE LITHOGRAPHY FOR THE FABRICATION OF GEOMETRIC PHASE HOLOGRAMS

(71) Applicant: North Carolina State University, Raleigh, NC (US)

(72) Inventors: Michael J. Escuti, Cary, NC (US); Matthew N. Miskiewicz, Raleigh, NC (US); Jihwan Kim, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 27 days.

(21) Appl. No.: 14/435,005

(22) PCT Filed: Oct. 15, 2013

(86) PCT No.: PCT/US2013/064939
§ 371 (c)(1),
(2) Date: Apr. 10, 2015

(87) PCT Pub. No.: WO2014/062615
PCT Pub. Date: Apr. 24, 2014

(65) Prior Publication Data
US 2015/0331167 A1 Nov. 19, 2015

Related U.S. Application Data

(60) Provisional application No. 61/713,770, filed on Oct. 15, 2012.

(51) Int. Cl.
*G03H 1/02* (2006.01)
*G02B 5/30* (2006.01)
(Continued)

(52) U.S. Cl.
CPC ......... *G02B 5/3083* (2013.01); *G02B 5/3016* (2013.01); *G02B 5/32* (2013.01);
(Continued)

(58) Field of Classification Search
CPC .. G02B 5/3083; G02B 5/3016; G02B 27/286; G02B 5/3025; G02B 27/283; G02B 5/30;
(Continued)

(56) References Cited

U.S. PATENT DOCUMENTS

2004/0114143 A1 6/2004 Van Haren et al.
2004/0180294 A1 9/2004 Baba-Ali et al.
(Continued)

FOREIGN PATENT DOCUMENTS

CN 1918506 A 2/2007
CN 1292496 C 12/2007
(Continued)

OTHER PUBLICATIONS

International Search Report and Written Opinion for PCT/US2013/064939 mailed Apr. 17, 2014.
(Continued)

*Primary Examiner* — Jade R Chwasz
(74) *Attorney, Agent, or Firm* — Myers Bigel, P.A.

(57) ABSTRACT

A direct-write lithography apparatus includes a polarization selector stage configured to vary a polarization orientation angle of light from a light source, a focusing element configured to focus the light from the light source into a spot at a focal plane thereof, and a scanning stage configured to scan the spot in at least two dimensions along a surface of a polarization-sensitive recording medium that is arranged proximate to the focal plane such that neighboring scans substantially overlap. The polarization selector stage and the scanning stage are configured to be operated independently of one another. Related fabrication methods of and optical elements fabricated thereby are also discussed.

27 Claims, 4 Drawing Sheets

(51) Int. Cl.
*G02B 27/28* (2006.01)
*G03F 7/20* (2006.01)
*G02B 26/10* (2006.01)
*G02B 5/32* (2006.01)
*G03H 1/08* (2006.01)
*G03H 1/04* (2006.01)

(52) U.S. Cl.
CPC ......... *G02B 26/101* (2013.01); *G02B 27/286* (2013.01); *G03F 7/70191* (2013.01); *G03F 7/70383* (2013.01); *G03F 7/70566* (2013.01); *G03H 1/0248* (2013.01); *G03H 1/0476* (2013.01); *G03H 1/08* (2013.01); *G03H 2001/0478* (2013.01); *G03H 2222/31* (2013.01); *G03H 2240/15* (2013.01)

(58) Field of Classification Search
CPC .......... G02B 27/26; G02B 5/32; G02B 5/001; G02B 6/0056; G02B 26/101; G02B 6/2773; G02F 1/133528; G02F 1/0136; G02F 1/13362; G03H 1/0248; G03H 1/0476
USPC .......... 359/3, 204.3, 484.01, 485.01, 490.01, 359/490.02, 490.03
See application file for complete search history.

(56) References Cited

U.S. PATENT DOCUMENTS

| | | |
|---|---|---|
| 2004/0266207 A1 | 12/2004 | Sirringhauss et al. |
| 2005/0207637 A1* | 9/2005 | Nakano ............... G03F 7/70566 382/145 |
| 2006/0192937 A1 | 8/2006 | Kerkhof et al. |
| 2006/0219676 A1 | 10/2006 | Taylor et al. |
| 2006/0286488 A1 | 12/2006 | Rogers et al. |
| 2008/0278675 A1 | 11/2008 | Escuti et al. |
| 2012/0081687 A1 | 4/2012 | Burrow et al. |
| 2012/0188467 A1 | 7/2012 | Escuti et al. |

FOREIGN PATENT DOCUMENTS

| | | |
|---|---|---|
| CN | 101133348 A | 2/2008 |
| WO | WO 2006/092758 | 9/2006 |
| WO | WO 2007/090546 | 8/2007 |

OTHER PUBLICATIONS

Extended European Search Report for corresponding EP Application No. 13846876 mailed Jun. 21, 2016.
Chinese Office Action Corresponding to Chinese Patent Application No. 201380053614.X; Date Mailed: Oct. 10, 2016; Foreign Text, 12 Pages, English Translation Thereof, 18 Pages.

* cited by examiner

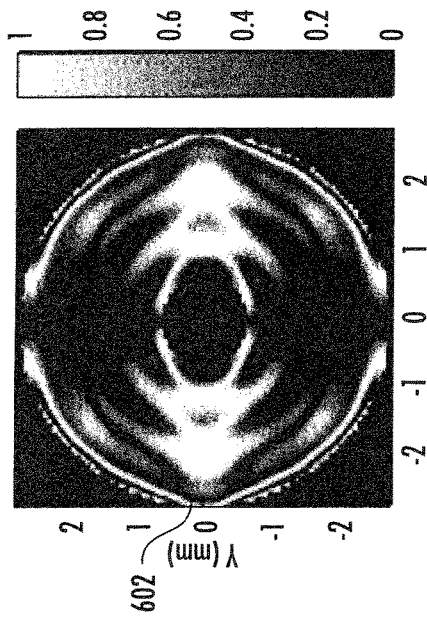
FIG. 6A
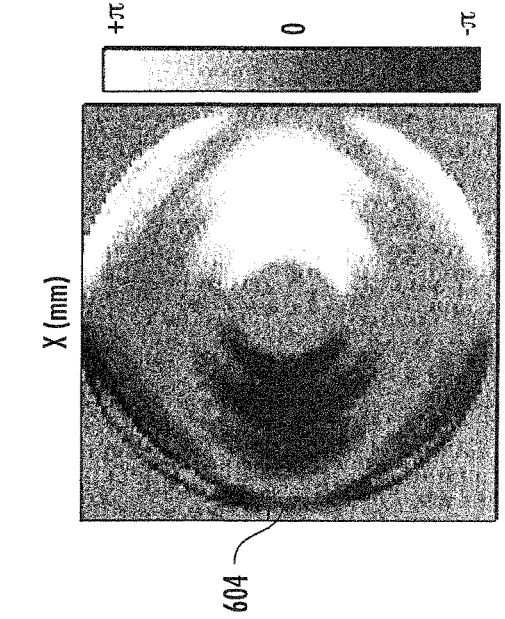
FIG. 6B
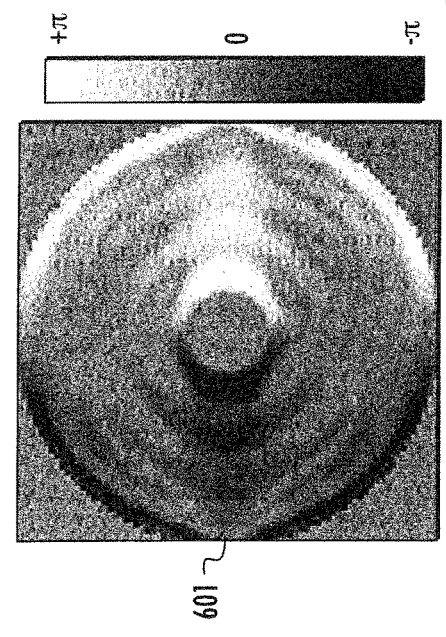
FIG. 6C
FIG. 6D

DIRECT WRITE LITHOGRAPHY FOR THE FABRICATION OF GEOMETRIC PHASE HOLOGRAMS

CLAIM OF PRIORITY

This application is a 35 U.S.C. §371 national phase application of PCT International Application No. PCT/US2013/064939 having an international filing date of Oct. 15, 2013, which claims priority from U.S. Provisional Patent Application No. 61/713,770 filed on Oct. 15, 2012, the disclosures of which are incorporated by reference herein in their entireties. The above PCT International Application was published in the English language as International Publication No. WO 2014/062615 A1.

STATEMENT OF GOVERNMENT SUPPORT

This invention was made, at least in part, with United States governmental support awarded by National Science Foundation Grant No. 0955127. The United States Government has certain rights in this invention.

FIELD

The present invention relates to birefringent optical elements and related fabrication methods.

BACKGROUND

Patterned birefringent elements have been studied for many applications, including displays, optical communications, astronomy, polarization holography, and polarimetry. One way to embody an inhomogeneous birefringence element is using photo-alignment technology combined with liquid crystal materials.

Photo-alignment polymers have been developed for use in liquid crystal displays and other optical elements where it may be desirable to have different orientations of the optical axis at different regions on the sample. Photo-alignment polymers may be exposed (i.e., patterned) using UV lamps or lasers shining through one or more fixed shadow masks, or using holographic intensity interference, to create aligned domains within which there can be predominantly uniform optical axis orientations. Polarization holography can also be used to create alignment profiles with continuous variation of the optical axis orientation to form polarization gratings. This polarization holographic lithography method can be expanded to a general case, where arbitrary linear polarization maps (e.g., spatially-varying polarization patterns) can be produced and recorded from the wavefront of many physical elements. These methods typically involve a small number of exposures with fixed patterns (for example, one or two exposures), without scanning of the illuminating light or shadow mask (if used).

Other methods to fabricate certain patterned retarders with photo-alignment principles may involve scanning in some way, and may be referred to as direct write lithography. For example, a class of waveplates called q-plates (or vortex retarders) can be created using a line- or wedge-shaped aperture and/or lens to create an illumination beam that is rotationally scanned while the recording medium may also be rotationally scanned. This method may use one (or two) dimensions of scanning, and may be limited to spatial patterns that are rotationally symmetric and polarization patterns that are radially uniform. Similarly, a cylindrical lens and a rotating waveplate may be arranged to create a line-shaped beam while the recording medium is linearly scanned in one dimension to produce a polarization grating (PG). This method may use two dimensions of scanning as well, and may be limited to spatial patterns that are one-dimensional.

Other direct write approaches for polarization sensitive media may scan a small polarized spot that has been focused by a lens. In one case, this polarized spot can be scanned across the area of a polarization-sensitive plate using one linear and one rotational stage, and a surface-relief pattern can be recorded by how long each position is illuminated.

In another direct write approach, a polarized spot may be scanned in three dimensions, but all three dimensions may occur in a single element, i.e., the recording medium mount. That is, the spatial scanning and the polarization selection may be inherently coupled. A rectangular aperture may also be arranged immediately before the recording medium to force the illuminating spot to have a step-shaped intensity profile. This configuration may be used to fabricate planar optical waveguides.

Yet another direct write approach provides a fabrication method for computer generated polarization holograms. While this approach may include three-dimensions of computer control, it may also require a square aperture stop to produce a spot at the sample with a step-shaped intensity profile. This can also be used to create an array of discrete exposure squares called "cells" within which the polarization may be uniform, and where overlap of neighboring "cells" may be detrimental. Therefore, stepwise/discrete scanning may be necessary.

In still another direct write approach, a pulsed laser may be used to create a spatially varied form-birefringence in glass. "Micro-waveplates" may thus be formed as discrete spots. A uniform spot with step-shaped intensity may also be required.

SUMMARY

According to some embodiments described herein, an apparatus for direct writing of a patterned polarization map includes a light source configured to provide an at least partially collimated light beam, a polarization selector configured to allow computer-controlled scanning of at least the polarization orientation angle, a lens configured to focus the light beam into a spot with a smoothly varying intensity with an approximately Gaussian shape at a focal plane, a two-dimensional scanning system configured to be controlled by a computer, and a polarization sensitive recording medium arranged near the focal plane of the lens. The scanning system is configured to continuously scan the light beam over the recording medium such that neighboring scans spatially overlap, to create continuous variation in the time-averaged polarization map.

In some embodiments, the intensity of the light from the light source delivered to the polarization sensitive recording medium may be approximately uniform for up to the entire recording parameter space.

In some embodiments, the polarization sensitive recording medium may be substantially isotropic (as with many photo-alignment materials) or birefringent (as with many azobenzene polymers).

In some embodiments, the light source may be an ultraviolet (UV) laser configured to provide a collimated beam with linear polarization.

In some embodiments, the polarization selector may be a halfwave retarder arranged within a rotation stage.

In some embodiments, the polarization selector may include an electro-optic device. In some embodiments, the electro-optic device may be a Pockels cell. In some embodiments, the electro-optic device may be a Faraday rotator. In some embodiments, the electro-optic device may be a liquid crystal cell.

In some embodiments, the lens may be an objective lens with a magnification of at least 5 times (5×).

In some embodiments, the two-dimensional scanning system may include a pair of linear translation stages.

In some embodiments, the recording medium may be a thin layer of photo-alignment polymer sensitive to linearly polarized light, onto which a birefringent material layer may be subsequently arranged such that the respective local optical axes of the birefringent material layer may be aligned according to the pattern in the photo-alignment polymer. This may result in an optical element having a constant local retardation and a spatially-varying local optical axis.

In some embodiments, the recording medium may be a photo-alignment polymer, and the birefringent layer coated on top may be a liquid crystal layer.

In other embodiments the recording medium may itself be both polarization sensitive and allow for an induced birefringence, for example, a class of polymers with isomerizing chemistry including azobenzene-containing polymers.

In some embodiments, the elements are arranged in the following sequence: UV laser, polarization selector, objective lens, recording medium, and linear translation stages.

In further embodiments, the light source may be a UV laser producing a collimated beam with linear polarization.

In further embodiments, the polarization selector may be a halfwave retarder arranged within a rotation stage.

In further embodiments, the polarization selector may be a Pockels cell and a quarter-wave plate, where the quarter-wave plate may be arranged to receive light output from the Pockels cell.

In further embodiments, the spherical lens may be configured to provide a focal spot that is about 1 mm or less in diameter.

In further embodiments, the two-dimensional scanning system may include a pair of angularly tilting mirrors steering into a solid angle including both elevation and azimuth.

In further embodiments, the recording medium may be a thin layer of photo-alignment polymer sensitive to linearly polarized light, onto which a liquid crystal layer may be subsequently arranged.

In further embodiments, the elements are arranged in the following sequence: UV laser, lens, angular scanning mirrors, polarization selector, and recording medium.

In still further embodiments, a second lens may be provided in between the polarization selector and the recording medium, which may provide additional beam conditioning.

According to further embodiments described herein, an apparatus includes a polarization selector stage configured to vary a polarization of light from a light source among a plurality of polarizations, a focusing element configured to focus the light from the light source into a spot at a focal plane thereof, and a scanning stage configured to scan the spot and a surface of a polarization-sensitive recording medium relative to one another, where the recording medium is arranged proximate to the focal plane. The scanning stage is configured to scan the spot in at least two dimensions along the surface of the recording medium such that neighboring scans substantially overlap. The polarization selector stage and the scanning stage are configured to be operated independently to vary the polarization and scan the spot, respectively.

In some embodiments, the scanning stage may be configured to scan the spot along the surface of the recording medium with a spatial resolution smaller than a size of the spot.

In some embodiments, the scanning stage may be configured to continuously scan the spot along the surface of the recording medium.

In some embodiments, the apparatus may be configured to create optical axis orientation profiles in the recording medium. The optical axis orientation profiles may vary in at least one direction along the surface of the recording medium based on a time-average of ones of the plurality of polarizations.

In some embodiments, the focusing element may be configured to provide the spot having a diameter or other dimension of about 1 millimeter or less. In other embodiments, the spot may have a diameter or other dimension of about 200 micrometers or less. In still other embodiments, the spot may have a diameter or other dimension of about 50 micrometers or less.

In some embodiments, the polarization selector stage may be configured to be controlled independently of the scanning stage to provide a selectable polarization orientation angle.

In some embodiments, the polarization selector stage may include a rotatable retarder element, and the polarization orientation angle may be selectable within a plane defined by the at least two dimensions responsive to rotation of the retarder element.

In some embodiments, the scanning stage may include at least two linear translation stages configured to move the recording medium in the at least two dimensions relative to the spot.

In some embodiments, the polarization selector may be arranged between the light source and the focusing element.

In some embodiments, the scanning stage may include at least one mirror configured to be rotated about respective axes corresponding to the at least two dimensions.

In some embodiments, the scanning stage may be arranged between the focusing element and the focal plane of the focusing element, and the retarder element may be arranged between the scanning stage and the focal plane of the focusing element.

In some embodiments, the apparatus may be configured to vary an intensity of the light from the light source independent of operation of the polarization selector stage and the scanning stage.

In some embodiments, the light from the light source may be an at least partially collimated light beam having linear polarization.

In some embodiments, the light from the light source may be ultraviolet (UV) light.

In some embodiments, the spot may have a smoothly varying, non-constant intensity profile at the focal plane.

According to other embodiments described herein, a direct-write lithography method includes varying a polarization of light from a light source among a plurality of polarizations, focusing the light from the light source into a spot at a focal plane, and scanning the spot and a surface of a polarization-sensitive recording medium relative to one another, where the recording medium is arranged proximate to the focal plane. The spot is scanned in at least two dimensions along the surface of the recording medium such that neighboring scans substantially overlap. The varying of the polarization and the scanning of the spot are performed independently.

In some embodiments, the spot may be scanned along the surface of the recording medium with a spatial resolution smaller than a size of the spot.

In some embodiments, the spot may be continuously scanned along the surface of the recording medium.

In some embodiments, the scanning may create optical axis orientation profiles in the recording medium that vary along the surface thereof based on a time-average of ones of the plurality of polarizations.

In some embodiments, the polarization may be varied independently of the scanning to provide a selectable polarization orientation angle.

In some embodiments, the polarization orientation angle may be varied by rotating a retarder element independently of the scanning such that the polarization orientation angle is selectable within a plane defined by the at least two dimensions responsive to rotation of the retarder element.

In some embodiments, the spot may be scanned by moving the recording medium in the at least two dimensions relative to the spot.

In some embodiments, the spot may be scanned by rotating at least one mirror about respective axes corresponding to the at least two dimensions.

In some embodiments, a birefringent material layer may be formed on the recording medium such that respective local optical axes thereof are aligned according to the respective optical axis orientation profiles in the recording medium.

In some embodiments, an intensity of the light from the light source may be varied independent of the varying of the polarization and the scanning of the spot.

In some embodiments, an at least partially collimated light beam having linear polarization may be provided as the light from the light source.

According to yet other embodiments described herein, an optical element includes a birefringent material layer having local optical axis orientations that vary in at least one direction along a surface thereof. The local optical axis orientations correspond to optical axis orientation profiles formed by varying a polarization of light from a light source among a plurality of polarizations, focusing the light from the light source into a spot at a focal plane, and scanning the spot in at least two dimensions along a surface of a polarization-sensitive recording medium arranged proximate to the focal plane such that neighboring scans substantially overlap, where the varying of the polarization and the scanning of the spot are performed independently.

In some embodiments, the recording medium may be a photo-alignment layer, and the birefringent material layer may be a liquid crystal layer that is on the photo-alignment layer.

In some embodiments, the birefringent material layer may be an azobenzene polymer layer that is used as the recording medium In some embodiments, the local optical axis orientations may vary non-linearly in at least one direction along the surface of the birefringent material layer to define a pattern having a varying periodicity.

In some embodiments, the periodicity at a central portion of the birefringent material layer may be greater than the periodicity at an edge portion thereof.

In some embodiments, the local optical axis orientations may vary linearly in at least one direction along the surface of the birefringent layer to define a pattern having a constant periodicity.

In some embodiments, the local optical axis orientations may vary in first and second dimensions along the surface of the birefringent optical element.

In some embodiments, the birefringent layer may include adjacent first and second regions positioned side-by-side, and the local optical axis orientations in the first and second regions may have different periodicities.

According to still other embodiments described herein, an optical element includes a polarization-sensitive recording medium having optical axis orientation profiles therein that continuously vary along a surface thereof according to a time-average of a plurality of polarizations corresponding to overlapping exposures to light having a varying polarization. The polarization sensitive recording medium may be substantially isotropic (as with many photo-alignment materials) or birefringent (as with many azobenzene polymers).

Other apparatus and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 2A illustrates a one-dimensional geometric phase lens; FIG. 2B illustrates a two-dimensional geometric phase lens (where bars indicate the local optical axis direction, and $\Phi(x,y)$ is the angle of the optical axis relative to the x-axis); and FIG. 2C illustrates another example polarization map that includes elliptical polarizations.

FIGS. 6A-6D illustrate experimental results of a GPH formed to be a vector apodizing phase plate (APP) according to further embodiments of the present invention: FIG. 6A illustrates a desired phase profile; FIG. 6B illustrates a calculated intensity of the GPH between crossed polarizers; FIG. 6C illustrates a measured intensity of the GPH in a polarizing optical microscope with crossed polarizers; and FIG. 6D illustrates a the measured phase resulting from the fabricated GPH.

FIG. 7A illustrates a q-plate, around its singularity; FIG. 7B illustrates a polarization grating (PG) with a one full period shown; and FIG. 7C illustrates a school mascot.

DETAILED DESCRIPTION OF EMBODIMENTS

Figure 1:
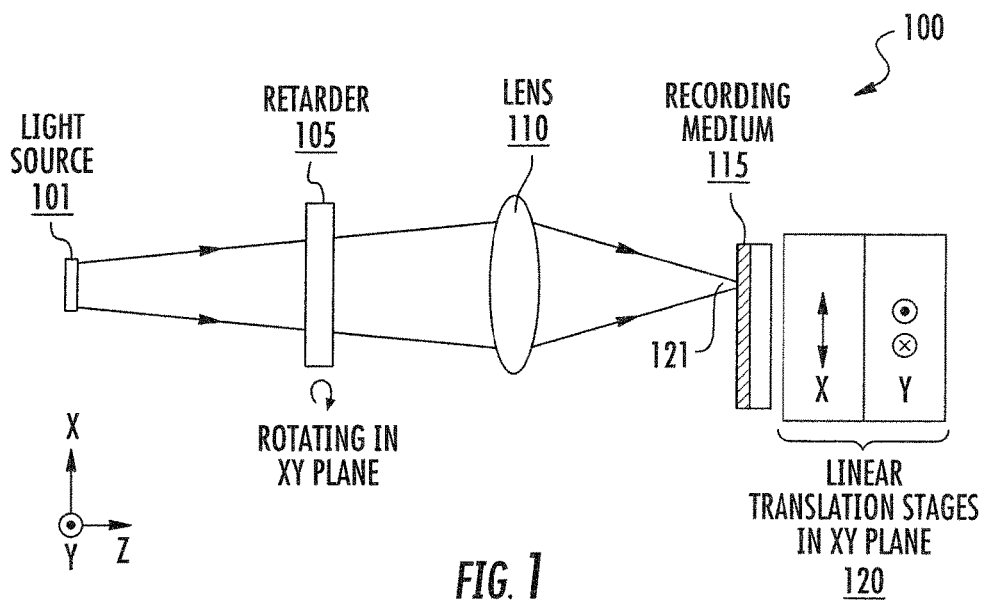
FIG. 1 illustrates a layout of a direct write lithography system according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to cover an underlying layer.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Some embodiments of the present invention provide direct write lithography systems, methods, and apparatus for creating an inhomogeneous polarization pattern (also referred to herein as a polarization map), which may be used to create a class of patterned birefringent elements, such as optical retarders. In particular, embodiments of the present invention described herein provide methods, systems, and apparatus to create a patterned retarder with an arbitrary inhomogeneous optical axis orientation profile, via computer-controlled scanning in three dimensions (e.g., with three degrees of freedom) of a polarization map. Embodiments as described herein may be more capable and less complex than some prior art approaches. The patterned birefringent elements that can be produced may be called geometric phase holograms (GPH), which may have advantageous properties that are not matched by other elements. Furthermore, the use of three dimensions or degrees of control to scan a beam and set its polarization orientation can enable substantially more precision, resolution, and can allow for the creation of GPH elements without the need of first having a physical version of the element.

FIG. 1 illustrates a direct laser writing system 100 in accordance with some embodiments of the present invention. Operation of the embodiment of FIG. 1 is as follows. As shown in FIG. 1, light from a light source (such as an ultraviolet (UV) laser light source) 101, which is collimated and linearly polarized, is provided incident on a polarization selector stage (illustrated as a halfwave retarder 105) that is mounted in a computer-controlled rotation mount such that the retarder 105 is rotatable about an axis perpendicular to the XY plane. Since this retarder 105 is mounted within a computer-controlled rotation mount, the output light beam will be linearly polarized with a selectable linear polarization orientation angle (i.e., within the XY plane in FIG. 1) achieved by rotation of the polarization axis of the linearly polarized light beam. A focusing element (illustrated as an objective lens 110) is positioned to focus this light beam onto a surface of a recording medium 115 as a relatively small spot 121, which is substantially linearly polarized with an orientation angle determined by the rotation of the halfwave retarder 105.

The recording medium 115 may be a thin layer of photo-alignment polymer, which is sensitive to the linearly polarized light. A two-dimensional scanning system including two computer-controlled linear translation stages 120 determines the position of the illumination within the area of the recording medium 115. The three computer-controlled elements (that is, the rotation mount including the retarder 105 and the two linear translation stages 120) are varied over time to scan the spot 121 over the desired area along the surface of the recording medium 115, where the time-averaged linear polarization map is exposed onto the photo-alignment polymer 115 as an orientation profile. Any scan profile(s) may be employed, including, but not limited to, a raster, spiral, or concentric circles. The intensity of the illumination from the light source 101 that is delivered to the polarization-sensitive recording medium 115 may be approximately uniform for the up to the entire recording parameter space in some embodiments. However, it will be understood that the intensity of the illumination from the light source 101 could be varied in other embodiments to provide an additional control factor.

One feature of some embodiments of the present invention is the intentional overlap of neighboring continuous scans of the spot 121 in the x-, y-, and/or rotating dimensions. This overlap can create polarization maps (and therefore, optical axis profiles) in the recording medium 115, with spatial resolution smaller than the size of the illuminating spot 121 because the recording medium 115 is sensitive to the time-average of some or all illuminating polarizations. For example, embodiments of the present invention may be used to achieve a spatial resolution on the order of a few microns or less. Accordingly, when a liquid crystal (or other birefringent) material is coated onto this patterned photo-alignment layer (or other patterned surface) 115, the local optical axes of the coated material will follow the orientation profiles in the patterned alignment surface 115. The resulting element will have a constant local retardation and a spatially-varying optical axis, and is referred to herein as a geometric phase hologram (GPH).

A GPH is a particular kind of patterned retarder, with an inhomogeneous local optical axis. More specifically, a GPH is a birefringent (or dichroic, or some combination of the two) optical element that can reconstruct the phase of an object wave (or its conjugate) by modulating the geometric phase (or Pancharatnam-Berry phase), which results from a change in polarization states, rather than the dynamic phase, which results from optical path length difference effects. In particular, the GPH does not create an optical phase difference by changing the optical path length and the dynamic phase, but rather, it may introduce an optical phase difference by manipulating the polarization of an optical field and thereby the geometric phase. While some elements may fit this description, there have been challenges in fabricating such elements. A GPH has an optical axis orientation angle $\Phi(x)$ or $\Phi(x,y)$, which is directly proportional to a desired phase difference profile, with a retardation that is approximately constant throughout its area.

Many optical elements can be formed as a GPH, including, but not limited to, lenses, prisms, surface-relief elements, diffractive optical elements, and micro-optics. When transformed into a GPH, their holographic versions may be thin-films, substantially more compact, and in many cases, with additional advantageous features. Elements that may be formed in accordance with embodiments of the present invention may be referred to as computer generated GPH, or CG-GPH. Note that GPH are a subset of polarization holograms.

Figure 2A:
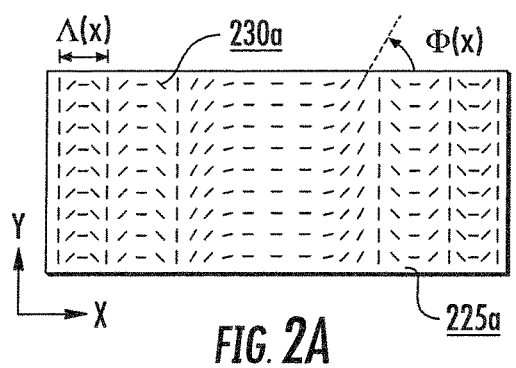
FIGS. 2A-2C illustrate examples of the spatially varying optical axis profiles in geometric phase holograms (GPHs) according to some embodiments of the present invention.

In some embodiments of the present invention, a non-linear variation of the local optical axis orientations as a function of position along the surface of the GPH may define a pattern having a continuously varying periodicity, such that the overall effect of the GPH may be to provide a lens effect. FIG. 2A illustrates an example of a GPH 225a in accordance with some embodiments of the present invention having an optical axis profile defined by local optical axes 230a having respective orientation angles $\Phi(x)$ varying in one dimension. The local period of the pattern $\Lambda(x)$ varies, where the period at the center is larger than the period of the edge. As an example, the function can be approximately $\Phi(x)=k\pi x^2$, where "k" is a non-zero constant that is related to a focal length of the GPH 225a. This pattern represents one particular example of a GPH 225a that functions as a polarization-sensitive cylindrical lens.

Figure 2B:
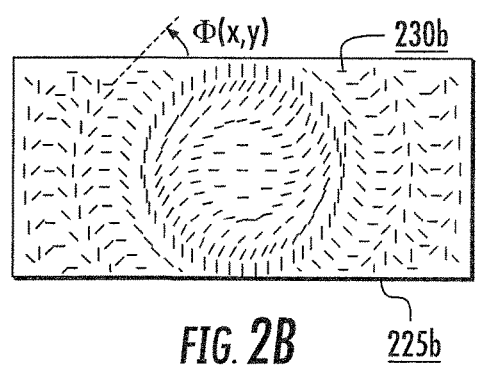
Figure 2C:
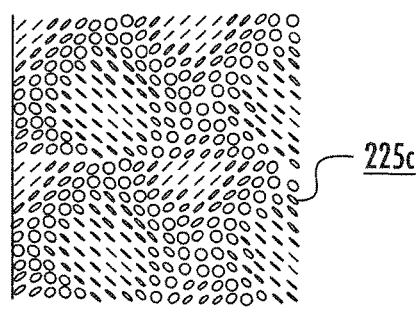

FIG. 2B illustrates another example of a GPH 225b in accordance with some embodiments of the present invention having an optical axis profile defined by local optical axes 230b having respective orientation angles $\Phi(x, y)=k\pi(x^2+y^2)$ varying in two-dimensions. The GPH 225b of FIG. 2B may act as polarization-sensitive spherical lens. Both of the examples of FIGS. 2A and 2B, as well as other examples with similar focusing/defocusing properties, may be referred to as geometric phase (GP) lenses. It should be noted that because these GP lenses 225a, 225b can be generated under the control of a computer, substantially aberration-free lenses can be produced, with approximately 100% efficiency for circular polarization, with the additional benefits of being a thin-film. Furthermore, large size optics (i.e., with diameters of ≥4 in) can be easier to fabricate, and with reduced weight. FIG. 2C illustrates another example polarization map 225c that includes elliptical polarizations.

As shown in the examples of FIGS. 2A and 2B with non-linear optical axis profiles, a GPH 225a, 225b can be considered a more complex version of the standard polarization grating (PG), having a one- or two-dimensional variation of its grating period $\Lambda$ along a surface thereof. The local optical axes of a GPH may also vary in a third dimension (e.g., over a thickness thereof), for example, in embodiments where the GPH is a chiral liquid crystal layer having a molecular structure that is rotated over the thickness thereof.

Figure 3A:
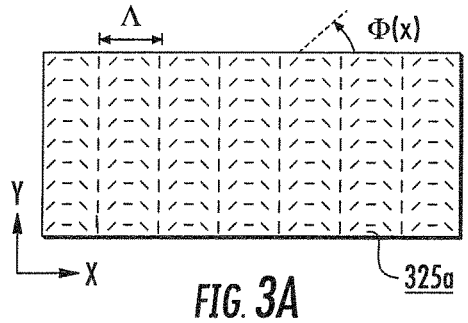
FIGS. 3A and 3B illustrate examples of spatially varying optical axis profiles in polarization gratings (PGs) according to some embodiments of the present invention.
Figure 3B:
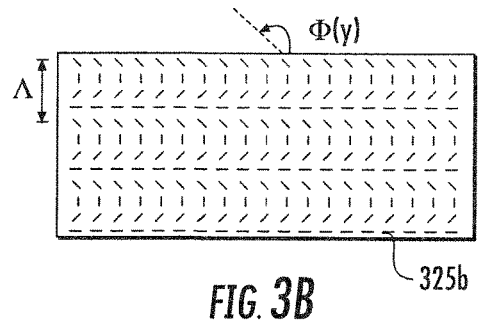

From another point of view, a standard polarization grating can be considered as merely a particular example of a GPH, implementing a linear phase profile, e.g., $\Phi(x)=\pi x/\Lambda$ or $\Phi(y)=\pi y/\Lambda$, where $\Lambda$ is the constant grating period, as shown in the polarization gratings (PGs) 325a and 325b of FIGS. 3A and 3B, respectively. In this context, the PGs 325a, 325b can be considered as a kind or type of GPH that may be formed in accordance with embodiments of the present invention.

Figure 4:
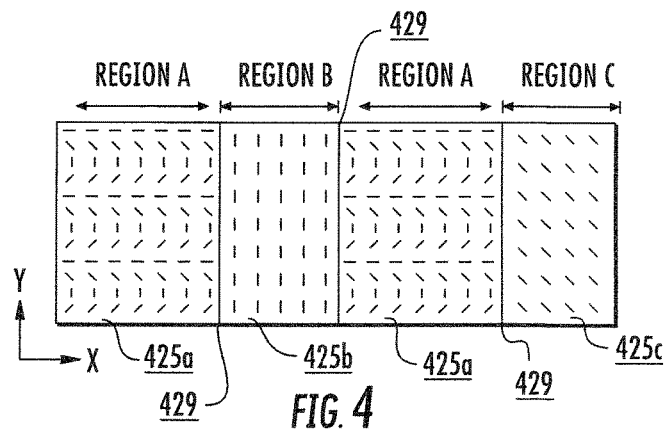
FIG. 4 illustrates an example of a spatially varying optical axis profile of a GPH with multiple regions containing continuous optical axis profiles with discrete boundaries therebetween according to some embodiments of the present invention.

It will be understood that while some GPH profiles are fully continuously varying, such as those discussed with reference to FIGS. 2A-C and 3A-3B, others may have continuous variations within regions with discrete boundaries in between. For example, the profiles illustrated in FIG. 4 show two or more regions (regions A 425a, B 425b, C 425c) with discrete boundaries between their respective continuous optical axis profiles. In FIG. 4, the regions A 425a, B 425b, C 425c are positioned side-by-side with discrete boundaries 429 between region A 425a and region B 425b, between region B 425b and region A 425a, and between region A 425a and region C 425c. Each of the regions A 425*a*, B 425*b*, C 425*c* may include optical axis profiles that differ with respect to optical axis orientations and/or periodicities.

Figure 5:
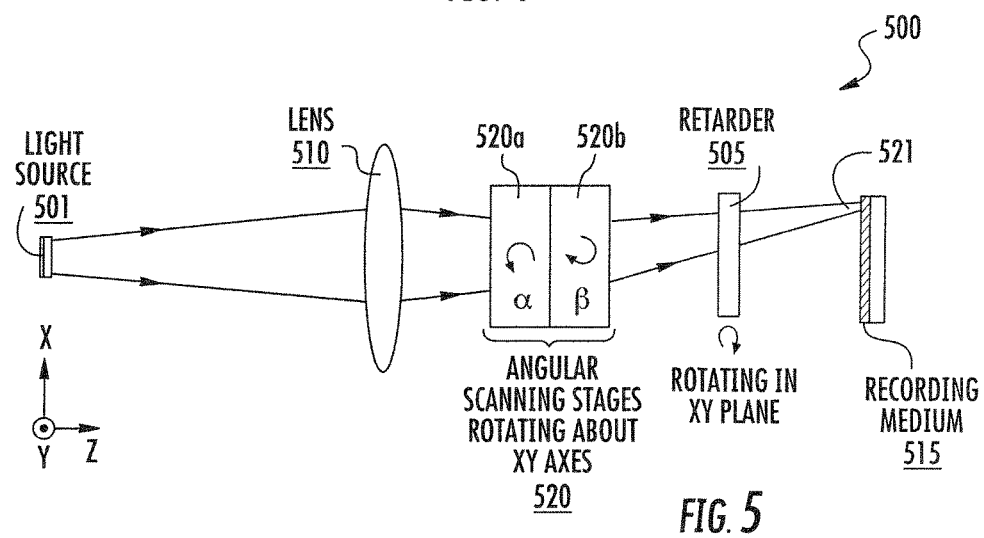
FIG. 5 illustrates a layout of a direct write lithography system according to further embodiments of the present invention.

FIG. 5 illustrates a direct laser writing system in accordance with further embodiments of the present invention. Operation of the embodiment of FIG. 5 is as follows. As shown in FIG. 5, light from a light source (illustrated as a UV laser 501), which is collimated and linearly polarized, is provided incident on a halfwave retarder 505. A focusing element (illustrated as a lens 510) is positioned to focus this light onto the recording medium 515 as a relatively small spot 521, which may be substantially linearly polarized with a polarization orientation angle determined by the rotation of the halfwave retarder 505. In some embodiments, a second lens or other focusing element can also be provided in between the halfwave retarder 505 and the recording medium 515, to provide additional beam conditioning. A two-dimensional scanning system 520 is implemented by two computer-controlled angular scanning mirrors 520*a* and 520*b* (e.g., a scanning galvanometer mirror system), which are arranged to receive the light from the lens 510 and determine the direction within the solid angle (and therefore position) of the illumination onto an area of the recording medium 515. In FIG. 5, the mirrors 520*a*, 520*b* are each rotatable around a different axis (e.g., the X-axis and the Y-axis); however, in other embodiments a single mirror that is rotatable around both the X- and Y-axes may be used. The recording medium 515 may be a thin layer of photo-alignment polymer, which is sensitive to the linearly polarized light. The retarder 505, mounted within a computer-controlled rotation mount, is arranged to receive the substantially linearly polarized light from the angular scanning mirrors 520*a*, 520*b*, in order to bring about a selectable linear polarization orientation angle (i.e., within the XY plane in FIG. 5) by rotation of the polarization axis of that linear polarization. The three computer-controlled elements (i.e., the rotation mount including the retarder 505 and the angular scanning mirror stage 520) are varied over time to scan the desired area within the recording medium 515, such that a time-averaged linear polarization map is exposed onto the photo-alignment polymer as an orientation profile. Any scan profile(s) may be employed, including, but not limited to, a raster, spiral, or concentric circles. The intensity of the illumination from the light source 501 that is delivered to the polarization-sensitive recording medium 515 may be approximately uniform for the up to the entire recording parameter space, and/or could be varied to provide an additional control factor.

As noted above with reference to FIG. 1, one feature of embodiments of the present invention over the prior art is the intentional substantial overlap of neighboring continuous scans in the x-, y-, and/or rotating dimensions. This overlap can create polarization maps, and therefore optical axis profiles, with spatial resolution smaller than the illuminating spot size because the recording medium is sensitive to the time-average of some or all illuminating polarizations. Accordingly, as with the embodiment of FIG. 1, when a liquid crystal material is coated onto this photo-alignment layer or other patterned recording medium, its local optical axes will follow the orientation profile in the patterned photo-alignment layer. The resulting geometric phase hologram (GPH) element will have a constant local retardation and a spatially-varying optical axis.

As non-limiting representative experimental examples, FIGS. 6A-6D and FIGS. 7A-7C illustrate several GPH profiles created in accordance with further embodiments of the present invention as shown in FIG. 5. FIG. 6A illustrates a desired phase profile 601 of a vector apodizing phase plate (vector APP), which may be used in coronagraph telescopes. The illustrated phase profile 601 was recorded in the optical axis orientation profile $\Phi(x, y)$ of the GPH. FIG. 6B illustrates the calculated intensity 602 of the GPH of FIG. 6A between crossed polarizers. FIGS. 6C and 6D illustrate measured intensity 603 and the measured phase profile 604 of the GPH observed between crossed polarizers, respectively. The spot size shown in the results of FIGS. 6C and 6D was approximately 200 μm, which can be used to record features approximately 50 μm in size.

Figure 7C:
FIGS. 7A-7C illustrate experimental results of different types of GPH according to some embodiments of the present invention.
Figure 7B:
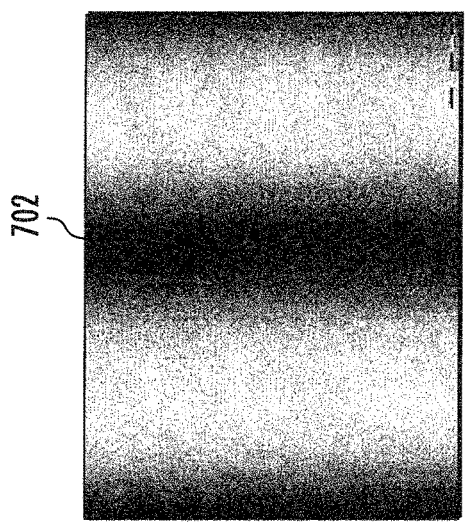
Figure 7A:
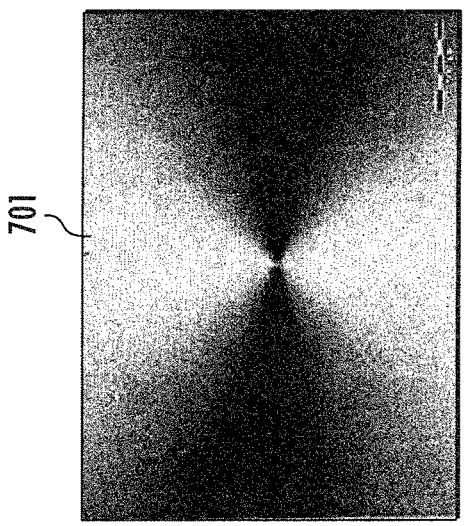

FIGS. 7A-7C illustrate further examples of profiles 701, 702, 703 created in accordance with embodiments of the present invention, including a q-plate around its singularity 701 (as shown in FIG. 7A), one full period of a PG 702 (as shown in FIG. 7B), and an image of a university mascot 703 (as shown in FIG. 7C). The result in FIG. 7C was formed with a spot size at the recording medium of approximately 50 μm, and the smallest feature size (i.e., resolution) was in the range 5-10 μm. Embodiments of the present invention may be used to realize a spatial resolution on the order of a few microns or less, and an orientation angle resolution of a few milliradians (mrad) or less.

Still further embodiments of the present invention provide mask fabrication methods using the GPH elements described herein. In particular, a GPH element can be formed using the fabrication methods described above, and this GPH element can be used as a mask to form GPH copies, for example, using the proximity lithography principles as described with reference to holographically-formed PG masks and other related elements in U.S. patent application Ser. No. 12/596, 168, the disclosure of which is incorporated by reference herein. In some embodiments, the GPH element can be tailored and/or optimized for UV wavelengths, arranged between a UV lamp and a copy substrate that is coated with the photo-alignment polymer, and positioned near the latter. By illuminating the GPH copy substrate through the GPH mask, the polarization pattern that was originally formed in the GPH mask can be transferred to the copy substrate. The copy substrate may be subsequently processed as if it were originally exposed in accordance with the above-described embodiments of the present invention (e.g., a birefringent material layer may be formed on and aligned to the pattern on the surface of the copy substrate, as similarly discussed above).

Accordingly, by patterning a recording material layer using continuous scans with intentional overlap and 3 or more degrees of control, polarization maps with spatial resolution smaller than the illuminating spot size may be created in the recording medium based on the time-average of some or all illuminating polarizations. Thus, a liquid crystal or other birefringent material layer may be coated onto the patterned recording surface such that its local optical axes will follow the patterned orientation profiles, providing a patterned retarder having a constant local retardation and a spatially-varying or inhomogeneous optical axis.

While described herein primarily with reference to embodiments where the polarization sensitive recording medium is a photo-alignment polymer and the birefringent layer coated on top is a liquid crystal layer, it will be understood that other recording media may be used. For example, the recording medium may itself be both polarization sensitive and allow for an induced birefringence, such as a class of polymers with isomerizing chemistry including azobenzene-containing polymers. In other words, the polarization recording material may be substantially isotropic, as with many photo-alignment materials, or birefringent, as with many azobenzene polymers. In some embodiments, the polarization sensitive recording medium is a planar thin film or plate, while in other embodiments the polarization sensitive recording medium may be non-planar, e.g., a curved surface.

A GPH fabricated in accordance with embodiments of the present invention may have a broadband spectrum, using for example the techniques of achromatic PG and MTRs as described in U.S. patent application Ser. Nos. 12/596,189 and 13/646,166, the disclosures of which is incorporated by reference herein.

As used herein, the phrase "computer-controlled" may refer to any electrical control system suitable to control the opto-mechanical elements (for example, a digital computer connected to motor driver circuits via USB). While some embodiments of the present invention described herein scan continuously, in other embodiments an electrically-controlled shutter may also be arranged at the output of the laser to control the illumination timing.

In some embodiments, one or more fixed mirrors may be added in between some of the principal elements, for example, before or after the lens. In some embodiments, a single tilting mirror with two-dimensions of control could be employed. This would be the case, for example, with piezo-electric fine steering mirrors.

In some embodiments, the spot resulting from the lens can have circularly symmetric intensity profile, such as a Gaussian function. In other embodiments the spot resulting from the lens may be another shape, including elliptical or linear. More generally, the spot defined by the beam as output from the lens can have a smoothly varying, non-constant intensity profile, and can define various shapes.

In some embodiments, the light from the light source is a single beam. In other embodiments the light from the light source may be multiple beams controlled in parallel through the subsequent optics described above, such that multiple spots in the recording medium area are illuminated at a given time. The intensity of the light from the light source (as delivered to the polarization sensitive recording medium) may be approximately or substantially uniform for up to the entire recording parameter space.

In embodiments of the present invention, the incident light may be fully or partially polarized, with any polarization, wavelength, or angular divergence. Embodiments of the present invention can provide birefringent films that are substantially uniaxial, biaxial, or neither (i.e., complex retarder without an overall optical axis).

It will be understood that, in some embodiments, the light source could be an elliptically polarized or partially polarized light (e.g. such as that from some laser diode and LED light sources).

In some embodiments, light source conditioning optics, including, but not limited to, beam expanders, spatial-filters, aperture stops, and/or fixed polarization elements, may be arranged anywhere before the objective lens. For example, the light source may be a lamp or LED that is substantially unpolarized or partially polarized, where a fixed polarizing element (e.g., a polarizer) is added before or as part of the polarization selector.

In some embodiments, the polarization selector stage may comprise one or more mechanically rotating waveplates and/or polarizers. In other embodiments, the polarization selector stage may include an element with an electrically controllable birefringence, such as a Pockels cell, variable liquid crystal retarder, or acousto-optical-modulator. In further embodiments, combinations of electrically controllable, mechanically controllable, and fixed polarization elements may be employed within the polarization selector stage.

It will be understood that, as described herein, the terminology "retarder" and "waveplate" may be used interchangeably, and the following additional terms are also to be considered equivalent, unless otherwise indicated: any "retardation plate", "compensation film", and "birefringent plate" that is uniaxial, biaxial, or inhomogeneous. Retarders as described herein may be broadband (i.e., achromatic) or narrowband (i.e., chromatic). Retarders as described herein may therefore accomplish a polarization change via optical rotation or birefringence retardation, or any combination thereof. In some embodiments, the retarders described herein may not significantly affect or alter the direction of propagation of light passing therethrough. In some embodiments, the retarders described herein may respond to an applied electrical voltage.

Embodiments of the present invention are described herein with reference to liquid crystal (LC) materials. Liquid crystals may include liquids in which an ordered arrangement of molecules exists. Typically, liquid crystal (LC) molecules may be anisotropic, having either an elongated (rod-like) or flat (disk-like) shape. As a consequence of the ordering of the anisotropic molecules, a bulk LC often exhibits anisotropy in its physical properties, such as anisotropy in its mechanical, electrical, magnetic, and/or optical properties. As a result of the rod-like or disk-like nature, the distribution of the orientation of LC molecules may play an important role in optical applications, such as in liquid crystal displays (LCDs). In these applications, LC alignment may be dictated by an alignment surface. The alignment surface may be treated so that the LC aligns relative to the surface in a controllable way.

As used herein, the liquid crystals can have a nematic phase, a chiral nematic phase, a smectic phase, a ferroelectric phase, and/or another phase. In addition, a number of photopolymerizable polymers may be used as alignment layers to create the optical layers described herein. In addition to being photopolymerizable, these materials may be inert with respect to the LC, should provide stable alignment over a range of operating temperatures of the LC device (e.g., from about −50° C. to about 100° C.), and should be compatible with manufacturing methods described herein. Additional examples of methods of liquid crystal alignment are also discussed in and U.S. Pat. No. 7,196,758 to Crawford et al. Furthermore, some structures described herein may involve precise fabrication through a balance of spin-coating processes and liquid crystal materials.

It will be understood by those having skill in the art that, as used herein, a "transmissive" or "transparent" substrate or element may allow at least some of the incident light to pass therethrough. In other words, transmissive or transparent elements described herein need not be perfectly transparent, and may have isotropic or dichroic absorption characteristics and/or may otherwise absorb some of the incident light. A transparent substrate may be a glass substrate in some embodiments. Also, "polymerizable liquid crystals" may refer to relatively low-molecular weight liquid crystal materials that can be polymerized, and may also be described herein as "reactive mesogens." In contrast, "non-reactive liquid crystals" may refer to relatively low-molecular weight liquid crystal materials that may not be polymerized.

While some embodiments are described herein with reference to nematic liquid crystal materials, it is also possible to accomplish the optical effect by other means in accordance with embodiments of the present invention. For example, isotropic materials with sub-wavelength structures can create a form-birefringence and can be structured in the same or similar way as described above. In another example, azobenzene containing polymers can be configured to be polarization sensitive and manifest a birefringence that can be structured in the same or similar way as described above. In other words, although primarily described herein with reference to optical axes as provided by nematic director orientations within a liquid crystal layer, it will be understood that optical axes as described herein may more generally refer to material properties. As such, it will be understood that embodiments of the present invention are not limited to the particular materials described herein, but may be implemented any and all material layers that function as described herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

Some embodiments described herein may be used to fabricate a geometric phase element. A geometric phase element is an anisotropic optical element having optical axis orientations that vary in one or more dimensions and/or in any manner, including but not limited to linear, nonlinear, and continuous or discontinuous optical axis variations, thereby affecting the polarization of incident light in such a way as to control the geometric phase. In some instances, the varying optical axis orientations may be generated by patterning a recording medium or other alignment surface using holography techniques, in which case the element may be referred to as a geometric phase hologram (GPH) element, or simply a GPH. However, geometric phase elements as described herein can also be created by various methods, including holographic interference and various other forms of lithography, and thus, a 'hologram' as described herein is not limited to creation by holographic interference, or 'holography'.

In the drawings and specification, there have been disclosed embodiments of the disclosure and, although specific terms are employed, they are used in a generic and descriptive sense only and not for purposes of limitation, the scope of the invention being set forth in the following claims.

That which is claimed:

1. An apparatus, comprising:
  a polarization selector stage configured to vary a polarization of light from a light source among a plurality of polarizations;
  a focusing element configured to focus the light from the light source into a spot at a focal plane thereof; and
  a scanning stage configured to scan the spot in at least two dimensions along a surface of a polarization-sensitive recording medium arranged proximate to the focal plane such that neighboring scans of the spot spatially overlap to record optical axis orientation profiles that vary along the surface of the recording medium according to a time-average of ones of the plurality of polarizations to which the recording medium is exposed in the overlap,
  wherein the polarization selector stage and the scanning stage are configured to independently vary the polarization and scan the spot, respectively.

2. The apparatus of claim 1, wherein the polarization selector stage is configured to independently vary the polarization of the light among the plurality of polarizations during the scan of the spot to record the optical axis orientation profiles that vary according to the time-average of the ones of the plurality of polarizations.

3. A direct-write lithography method, comprising:
  varying a polarization of light from a light source among a plurality of polarizations;
  focusing the light from the light source into a spot at a focal plane; and
  scanning the spot in at least two dimensions along a surface of a polarization-sensitive recording medium arranged proximate to the focal plane such that neighboring scans of the spot spatially overlap to record optical axis orientation profiles that vary along the surface of the recording medium according to a time-average of ones of the plurality of polarizations to which the recording medium is exposed in the overlap,
  wherein the varying the polarization is controlled independent of the scanning the spot.

4. The method of claim 3, wherein the scanning comprises:
  scanning the spot along the surface of the recording medium with a spatial resolution smaller than a size of the spot.

5. The method of claim 3, wherein the scanning further comprises:
  continuously scanning the spot comprising the light having the polarization that varies among the plurality of polarizations along the surface of the recording medium.

6. The method of claim 3, wherein varying the polarization comprises:
  controlling the polarization independent of the scanning to provide a selectable linear polarization orientation angle.

7. The method of claim 6, wherein varying the polarization further comprises:
  rotating a retarder element such that the polarization orientation angle is selectable within a plane defined by the at least two dimensions responsive to rotation thereof.

8. The method of claim 6, wherein scanning the spot comprises:
  moving the recording medium in the at least two dimensions relative to the spot.

9. The method of claim 8, wherein a polarization selector stage is arranged between the light source and a focusing element.

10. The method of claim 6, wherein scanning the spot comprises:
  rotating at least one mirror about respective axes corresponding to the at least two dimensions.

11. The method of claim 10, wherein a scanning stage is arranged between a focusing element and the focal plane thereof, and wherein a polarization selector stage is arranged between the scanning stage and the focal plane of the focusing element.

12. The method of claim 3, further comprising:
  providing an at least partially collimated light beam having linear polarization as the light from the light source.

13. The method of claim 12, wherein the light from the light source comprises ultraviolet (UV) light.

14. The method of claim 12, wherein the light source comprises a laser light source.

15. The method of claim 12, wherein the spot has a smoothly varying intensity profile at the focal plane.

16. The method of claim 3, further comprising:
varying an intensity of the light from the light source independent of the varying of the polarization and the scanning of the spot.

17. The method of claim 3, further comprising:
forming a birefringent material layer on the recording medium such that local optical axes thereof are aligned according to the optical axis orientation profiles in the recording medium.

18. The method of claim 3, wherein the varying the polarization of the light among the plurality of polarizations is controlled independent of and performed during the scanning of the spot to record the optical axis orientation profiles that vary according to the time-average of the ones of the plurality of polarizations.

19. An optical element, comprising:
a birefringent material layer having local optical axis orientations that vary in at least one direction along a surface thereof, wherein the local optical axis orientations correspond to optical axis orientation profiles formed by:
varying a polarization of light from a light source among a plurality of polarizations;
focusing the light from the light source into a spot at a focal plane; and
scanning the spot in at least two dimensions along a surface of a polarization-sensitive recording medium arranged proximate to the focal plane such that neighboring scans spatially overlap to define the optical axis orientation profiles that vary along the surface of the recording medium according to a time-average of ones of the plurality of polarizations to which the recording medium is exposed in the overlap,
wherein varying the polarization and scanning the spot are performed independently.

20. The element of claim 19, wherein the recording medium comprises a photo-alignment layer.

21. The element of claim 20, wherein the birefringent material layer comprises a liquid crystal layer formed on the surface of the recording medium.

22. The element of claim 19, wherein the birefringent material layer comprises an azobenzene polymer layer that is used as the recording medium.

23. The element of claim 19, wherein the local optical axis orientations vary non-linearly in the at least one direction along the surface of the birefringent material layer to define a pattern having a varying periodicity.

24. The element of claim 23, wherein the periodicity at a central portion of the birefringent material layer is greater than the periodicity at an edge portion thereof.

25. The element of claim 19, wherein the local optical axis orientations vary linearly in the at least one direction along the surface of the birefringent layer to define a pattern having a constant periodicity.

26. The element of claim 19, wherein the local optical axis orientations vary in first and second dimensions along the surface of the birefringent optical element.

27. The element of claim 19, wherein the birefringent layer includes adjacent first and second regions positioned side-by-side, and wherein the local optical axis orientations in the first and second regions have different periodicities.

* * * * *